(12) United States Patent
Wang et al.

(10) Patent No.: US 11,747,666 B2
(45) Date of Patent: Sep. 5, 2023

(54) WINDOWING DEVICE AND WINDOWING SYSTEM

(71) Applicants: BEIJING BOE SENSOR TECHNOLOGY CO., LTD., Beijing (CN); BOE TECHNOLOGY GROUP CO., LTD., Beijing (CN)

(72) Inventors: Yongbo Wang, Beijing (CN); Jing Yu, Beijing (CN); Chen Meng, Beijing (CN); Wei Sun, Beijing (CN); Zhong Hu, Beijing (CN); Dahai Hu, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 140 days.

(21) Appl. No.: 17/214,386

(22) Filed: Mar. 26, 2021

(65) Prior Publication Data
US 2022/0137448 A1 May 5, 2022

(30) Foreign Application Priority Data

Oct. 30, 2020 (CN) .......................... 202011194006.9

(51) Int. Cl.
*G02F 1/1333* (2006.01)
*G02F 1/1335* (2006.01)
(Continued)

(52) U.S. Cl.
CPC .......... *G02F 1/133385* (2013.01); *E06B 9/24* (2013.01); *G02F 1/13306* (2013.01);
(Continued)

(58) Field of Classification Search
CPC ......... H01L 35/28; H01L 35/30; H01L 35/32; H01L 35/325; G02F 1/133382;
(Continued)

(56) References Cited

U.S. PATENT DOCUMENTS

| 2012/0026315 A1* | 2/2012 | Lee ........................ G09G 3/006 348/125 |
| 2020/0076182 A1* | 3/2020 | Huang ...................... G09G 3/36 |
| 2020/0150602 A1* | 5/2020 | Trikha ...................... B32B 3/08 |

FOREIGN PATENT DOCUMENTS

| CN | 114270009 A | 4/2022 |
| CN | 115485158 A | 12/2022 |

(Continued)

*Primary Examiner* — Alexander P Gross
(74) *Attorney, Agent, or Firm* — BROOKS KUSHMAN P.C.

(57) ABSTRACT

A windowing device includes: a windowing module including a dimming transparent substrate and a semiconductor temperature adjustment element, the dimming transparent substrate being provided with different light transmittances when the dimming transparent substrate has different adjustment parameters; a temperature adjustment circuitry configured to input a current to the semiconductor temperature adjustment element and adjust a temperature of the semiconductor temperature adjustment element; a temperature sensor configured to detect a temperature of an environment where the windowing module is located; and a controller configured to input a circuitry adjustment signal to the temperature adjustment circuitry when the temperature detected by the temperature sensor is beyond a predetermined temperature range, as to adjust a temperature of the dimming transparent substrate to be within the predetermined temperature range.

16 Claims, 9 Drawing Sheets

(51) Int. Cl.
  *H10N 10/17* (2023.01)
  *H01L 23/38* (2006.01)
  *E06B 9/24* (2006.01)
  *G02F 1/133* (2006.01)

(52) U.S. Cl.
  CPC .... *G02F 1/13338* (2013.01); *G02F 1/133382* (2013.01); *G02F 1/133601* (2021.01); *H01L 23/38* (2013.01); *H10N 10/17* (2023.02); *G02F 2203/69* (2013.01)

(58) Field of Classification Search
  CPC ............. G02F 1/13625; G02F 2203/69; E06B 2009/2464; E06B 9/24; E06B 3/6722
  See application file for complete search history.

(56) References Cited

FOREIGN PATENT DOCUMENTS

KR   20150050107 A   *   5/2015
KR   20170049901 A   *   5/2017

\* cited by examiner

WINDOWING DEVICE AND WINDOWING SYSTEM

CROSS-REFERENCE TO RELATED APPLICATION

This application claims priority to Chinese Patent Application No. 202011194006.9 filed on Oct. 30, 2020, which is incorporated herein by reference in its entirety.

TECHNICAL FIELD

The present disclosure relates to the field of display technology, in particular to a windowing device and a windowing system.

BACKGROUND

Along with the development of the intelligent display technology, smart dimming glass is provided with different light transmittance depending on different voltages, temperatures and light intensities, so it has widely applied in different fields, e.g., electronic screen, vehicle window, traffic lamp and architectural glass.

As compared with electrochromic dimming glass, dye-doped liquid crystal dimming glass has a wider application prospect due to such advantages as rapid response and high contrast. However, in different application fields and regions, mobility of dye-doped liquid crystals in the dye-doped liquid crystal dimming glass is greatly different due to influences caused by a difference in a climate change in different seasons and a difference in a temperature in different regions.

On one hand, at a high temperature, the dye-doped liquid crystals have a small viscosity coefficient, so they are capable of being rapidly arranged in a twisted manner in an electric field direction under the effect of an electric field. On the other hand, at a low temperature, the dye-doped liquid crystals have a large viscosity coefficient, so it is necessary to apply the electric field thereto within a long time period so as to acquire a desired twisting angle. Based on this, due to the doping with dye, ionization may occur inside the liquid crystal to generate a built-in electric field when an external electric field is applied to the dye-doped liquid crystal at the high temperature. Further, at the low temperature, an adjustment voltage at a normal temperature is applied, and due to different states of the liquid crystals in different regions, an uneven light transmittance may occur within a long time period after the liquid crystals are energized. In addition, in the case of market use, a same operating voltage and an uneven light transmittance of the dimming glass may occur due to a difference in the temperature in different regions, e.g., with or without sunlight.

Based on the above, when the dye-doped liquid crystal dimming glass is adopted, it is necessary to prevent the occurrence of dimming abnormalities in different operating environments.

SUMMARY

In a first aspect, the present disclosure provides in some embodiments a windowing device, including: a windowing module including a dimming transparent substrate and a semiconductor temperature adjustment element arranged on the dimming transparent substrate, the dimming transparent substrate being provided with different light transmittances when the dimming transparent substrate has different adjustment parameters; a temperature adjustment circuitry coupled to the semiconductor temperature adjustment element, and configured to input a current to the semiconductor temperature adjustment element and adjust a temperature of the semiconductor temperature adjustment element; a temperature sensor arranged on the windowing module and configured to detect a temperature of an environment where the windowing module is located; and a controller coupled to the temperature sensor and the temperature adjustment circuitry, and configured to input a circuitry adjustment signal to the temperature adjustment circuitry when the temperature detected by the temperature sensor is beyond a predetermined temperature range, so that the temperature adjustment circuitry adjusts the current inputted to the semiconductor temperature adjustment element in such a manner as to adjust a temperature of the dimming transparent substrate to be within the predetermined temperature range through adjusting the temperature of the semiconductor temperature adjustment element.

In some possible embodiments of the present disclosure, the semiconductor temperature adjustment element includes one or more Peltier structures, the dimming transparent substrate includes a transparent frame body and a liquid crystal layer arranged within the transparent frame body, and the one or more Peltier structures are attached to an outer surface of the transparent frame body.

In some possible embodiments of the present disclosure, the semiconductor temperature adjustment element includes one or more Peltier structures, the dimming transparent substrate includes a transparent frame body and a liquid crystal layer arranged within the transparent frame body, and the one or more Peltier structures are formed within the transparent frame body.

In some possible embodiments of the present disclosure, when the one or more Peltier structures are arranged at the outer surface of the transparent frame body, each of two opposite side surfaces of the dimming transparent substrate is provided with one or more Peltier structures arranged in an array form. Each Peltier structure includes a first pole and a second pole coupled to each other. In the Peltier structures at each side surface, a first pole of one Peltier structure is coupled to a second pole of an adjacent Peltier structure. One or more Peltier structures on a first side surface of the two opposite side surfaces are arranged opposite to one or more Peltier structures on a second side surface of the two opposite side surfaces respectively, a first pole of a first Peltier structure of two opposite Peltier structures is arranged opposite to a second pole of a second Peltier structure of the two opposite Peltier structures, and a second pole of the first Peltier structure is arranged opposite to a first pole of the second Peltier structure. The first pole is one of an N pole and a P pole, and the second pole is the other one of the N pole and the P pole.

In some possible embodiments of the present disclosure, when the one or more Peltier structures are arranged within the transparent frame body, each Peltier structure includes a first pole, a second pole, and a transparent thermally-conductive line via which the first pole is coupled to the second pole. The first pole and the second pole of each Peltier structure are arranged at two opposite sides of the liquid crystal layer respectively, the thermally-conductive line is arranged inside the liquid crystal layer, the first poles and the second poles of the Peltier structures are arranged alternately at one side of the liquid crystal layer, and the first pole of each Peltier structure is coupled to the second pole of an adjacent Peltier structure. The first pole is one of an N pole and a P pole, and the second pole is the other one of the N pole and the P pole.

In some possible embodiments of the present disclosure, the first pole and the second pole of each Peltier structure are coupled to the thermally-conductive line via an insulating thermally-conductive adhesive.

In some possible embodiments of the present disclosure, the windowing device further includes a heat dissipation element coupled to each Peltier structure.

In some possible embodiments of the present disclosure, the windowing device further includes a heat dissipation element coupled to each Peltier structure.

In some possible embodiments of the present disclosure, the controller is configured to input a first circuitry adjustment signal to the temperature adjustment circuitry when the temperature detected by the temperature sensor is greater than an upper threshold of the predetermined temperature range, and input a second circuitry adjustment signal to the temperature adjustment circuitry when the temperature detected by the temperature sensor is smaller than or equal to a lower threshold of the predetermined temperature range. The temperature adjustment circuitry is further configured to input a current in a first direction to the semiconductor temperature adjustment element in accordance with the first circuitry adjustment signal, and input a current in a second direction to the semiconductor temperature adjustment element in accordance with the second circuitry adjustment signal.

In some possible embodiments of the present disclosure, the windowing module further includes a transparent display panel arranged opposite to the dimming transparent substrate, and an orthogonal projection of the transparent display panel onto a plane where the dimming transparent substrate is located is completely within the dimming transparent substrate.

In some possible embodiments of the present disclosure, the windowing module further includes a touch panel arranged at a side of the transparent display panel away from the dimming transparent substrate, an orthogonal projection of the touch panel onto the plane where the dimming transparent substrate is located covers the entire dimming transparent substrate, and the orthogonal projection of transparent display panel onto the plane where the dimming transparent substrate is located covers a part of the dimming transparent substrate.

In some possible embodiments of the present disclosure, the dimming transparent substrate includes a first dimming transparent substrate and a second dimming transparent substrate spliced together, the transparent display panel is arranged opposite to the first dimming transparent substrate, and the orthogonal projection of the transparent display panel onto the plane where the dimming transparent substrate is located is completely within the first dimming transparent substrate.

In some possible embodiments of the present disclosure, the windowing device further includes a first dimming driving module coupled to the first dimming transparent substrate and configured to input an adjustment parameter to the first dimming transparent substrate, and a second dimming driving module coupled to the second dimming transparent substrate and configured to input an adjustment parameter to the second dimming transparent substrate.

In some possible embodiments of the present disclosure, each Peltier structure is of an elongated shape, and the first pole of each Peltier structure and the second pole of the adjacent Peltier structure are arranged in a lengthwise direction of the Peltier structure.

In some possible embodiments of the present disclosure, the temperature adjustment circuitry is a direction-variable constant current source, and the temperature sensor is thin film temperature sensor.

In a second aspect, the present disclosure provides in some embodiments a windowing system including a windowing device. The windowing device includes: a windowing module including a dimming transparent substrate and a semiconductor temperature adjustment element arranged on the dimming transparent substrate, the dimming transparent substrate being provided with different light transmittances when the dimming transparent substrate has different adjustment parameters; a temperature adjustment circuitry coupled to the semiconductor temperature adjustment element, and configured to input a current to the semiconductor temperature adjustment element and adjust a temperature of the semiconductor temperature adjustment element; a temperature sensor arranged on the windowing module and configured to detect a temperature of an environment where the windowing module is located; and a controller coupled to the temperature sensor and the temperature adjustment circuitry, and configured to input a circuitry adjustment signal to the temperature adjustment circuitry when the temperature detected by the temperature sensor is beyond a predetermined temperature range, so that the temperature adjustment circuitry adjusts the current inputted to the semiconductor temperature adjustment element in such a manner as to adjust a temperature of the dimming transparent substrate to be within the predetermined temperature range through adjusting the temperature of the semiconductor temperature adjustment element.

In some possible embodiments of the present disclosure, the windowing device further includes: a plurality of control panels coupled to the windowing module; a power source coupled to the control panels and configured to provide electric energy for each control panel; and a fault detection module coupled to the control panels and the power source and configured to perform fault detection on the control panels and the power source.

In some possible embodiments of the present disclosure, the fault detection module includes: a multi-channel interface, each channel interface being coupled to one of the control panels; a signal conversion unit coupled to the multi-channel interface and configured to convert a voltage signal inputted by one channel interface into a digital signal; and a channel selection control unit configured to select one channel interface of the multi-channel interface and control the selected channel interface to be coupled to the signal conversion unit; a power source diagnosis unit coupled to the power source and configured to detect a voltage of the power source; and a diagnosis analysis unit coupled to the signal conversion unit and the power source diagnosis unit, and configured to perform fault detection on the control panel coupled to a corresponding channel interface in accordance with the digital signal for the channel interface converted by the signal conversion unit, and perform fault detection on the power source in accordance with a detection result of the power source analysis unit.

In some possible embodiments of the present disclosure, the windowing system further includes: an image collection module configured to collect a display state of the windowing module; and a computation gateway coupled to the control panels and the image collection module, and configured to transmit a control parameter to the control panels, acquire the display state collected by the image collection module, and compare the display state with a predetermined state in which the windowing module should be in accordance with the control parameter, so as to perform fault diagnosis.

In some possible embodiments of the present disclosure, the computation gateway is further configured to: transmit a testing picture to each control panel, and acquire, through the image collection module, a display state in which the testing picture is displayed by the transparent display panel of the windowing device; and perform fault diagnosis in accordance with the testing picture and the display state.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the related art, dimming abnormalities occur for dimming glass due to different light transmittances in different operating environments. An object of the present disclosure is to provide a windowing device, so as to detect, through a temperature sensor on the windowing module, a temperature of an environment where a windowing module is located, adjust, through a controller and a temperature adjustment circuitry, a temperature of a semiconductor temperature adjustment element on a dimming transparent substrate in accordance with the temperature detected by the temperature sensor, and adjust a temperature of the dimming transparent substrate to be within a predetermined temperature range, thereby to prevent the occurrence of the dimming abnormalities for the dimming glass due to different light transmittances in different operating environments.

Figure 1:
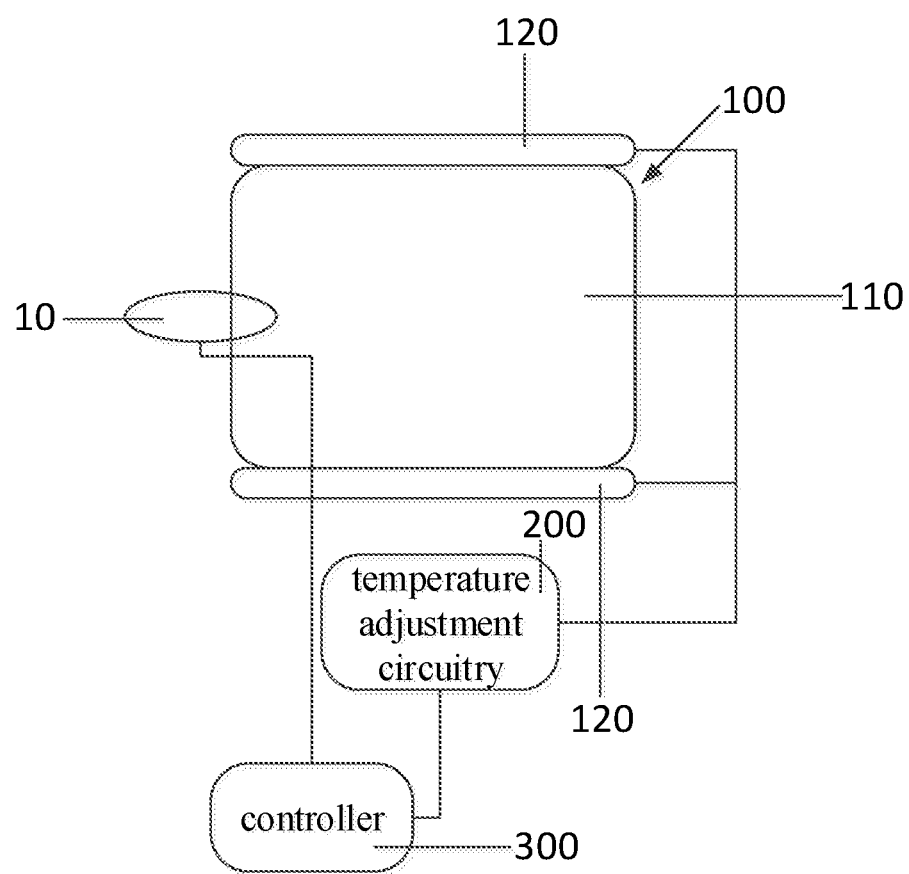
FIG. 1 is a schematic view showing a windowing device according to one embodiment of the present disclosure.

The present disclosure provides in some embodiments a windowing device which, as shown in FIG. 1, includes: a windowing module 100 including a dimming transparent substrate 110 and a semiconductor temperature adjustment element 120 arranged on the dimming transparent substrate 110, the dimming transparent substrate 100 being provided with different light transmittances when the dimming transparent substrate 110 has different adjustment parameters; a temperature adjustment circuitry 200 coupled to the semiconductor temperature adjustment element 120, and configured to input a current to the semiconductor temperature adjustment element 120 and adjust a temperature of the semiconductor temperature adjustment element 120; a temperature sensor 10 arranged on the windowing module 100 and configured to detect a temperature of an environment where the windowing module 100 is located; and a controller 300 coupled to the temperature sensor 10 and the temperature adjustment circuitry 200 respectively, and configured to input a circuitry adjustment signal to the temperature adjustment circuitry 200 when the temperature detected by the temperature sensor 10 is beyond a predetermined temperature range, so that the temperature adjustment circuitry 200 adjusts the current inputted to the semiconductor temperature adjustment element 120 in such a manner as to adjust a temperature of the dimming transparent substrate 110 to be within the predetermined temperature range through adjusting the temperature of the semiconductor temperature adjustment element 120.

In some possible embodiments of the present disclosure, the dimming transparent substrate 110 may be light-transmitting transparent substrate, which includes dye-doped dimming liquid crystals formed through doping liquid crystals in a nematic phase with dye. When no electric field is applied, liquid crystal molecules between two parallel substrates in the light-transmitting transparent substrate may be in a multi-domain arrangement state in a direction parallel to the substrate under the effect of an alignment layer. In addition, when the electric field has been applied, the liquid crystal molecules may be deflected gradually under the effect of the electric field, and converted from the multi-domain arrangement parallel in the direction parallel to the substrate to a single-domain arrangement state in a direction perpendicular to the substrate. At this time, visible light may be transmitted, rather than scattered, in the liquid crystal layer, and an OFF state may be converted into an ON state, so as to switch between a bright state and a dark state. Further, the light transmittance of the liquid crystal layer may be affected jointly by a mass percentage of the dye doped in the liquid crystal layer as well as a driving voltage, so as to adjust the light transmittance of incident light.

In some possible embodiments of the present disclosure, the semiconductor temperature adjustment element 120 may adjust the temperature on the basis of a Peltier principle. The semiconductor temperature adjustment element 120 may include a plurality of Peltier structures, and a direction-variable constant current source may be applied through the Peltier structures, so as to adjust the temperature of the dimming transparent substrate.

Hence, in the embodiments of the present disclosure, as shown in FIG. 1, in the case that the semiconductor temperature adjustment element 120 includes a plurality of Peltier structures, the controller 300 is configured to input a first circuitry adjustment signal to the temperature adjustment circuitry 200 when the temperature detected by the temperature sensor 10 is greater than an upper threshold of the predetermined temperature range, and input a second circuitry adjustment signal to the temperature adjustment circuitry 200 when the temperature detected by the temperature sensor 10 is smaller than or equal to a lower threshold of the predetermined temperature range.

The temperature adjustment circuitry 200 is further configured to input a current in a first direction to the semiconductor temperature adjustment element 120 in accordance with the first circuitry adjustment signal, and input a current in a second direction to the semiconductor temperature adjustment element 120 in accordance with the second circuitry adjustment signal.

It should be appreciated that, the semiconductor temperature adjustment element 120 on the dimming transparent substrate 110 for achieving a temperature adjustment effect may not be limited to be the Peltier structure, and instead, it may be any other kinds of semiconductor element whose temperature changes in accordance with the input current.

The specific structure of the windowing device in the embodiments of the present disclosure will be described hereinafter when the semiconductor temperature adjustment element 120 on the dimming transparent substrate 110 includes a plurality of Peltier structures.

In some possible embodiments of the present disclosure, when the semiconductor temperature adjustment element 120 includes a plurality of Peltier structures, the plurality of Peltier structure may be attached to an outer surface of the dimming transparent substrate 110, or formed inside the dimming transparent substrate 110, or both attached to the outer surface of the dimming transparent substrate 110 and formed inside the dimming transparent substrate 110, which will not be particularly defined herein.

To be specific, the dimming transparent substrate 110 may include a transparent frame body and a liquid crystal layer arranged within the transparent frame body. The plurality of Peltier structures may be attached to an outer surface of the transparent frame body, or formed within the transparent frame body, or both attached to the outer surface of the transparent frame body and formed within the transparent frame body, which will not be particularly defined herein.

Figure 2:
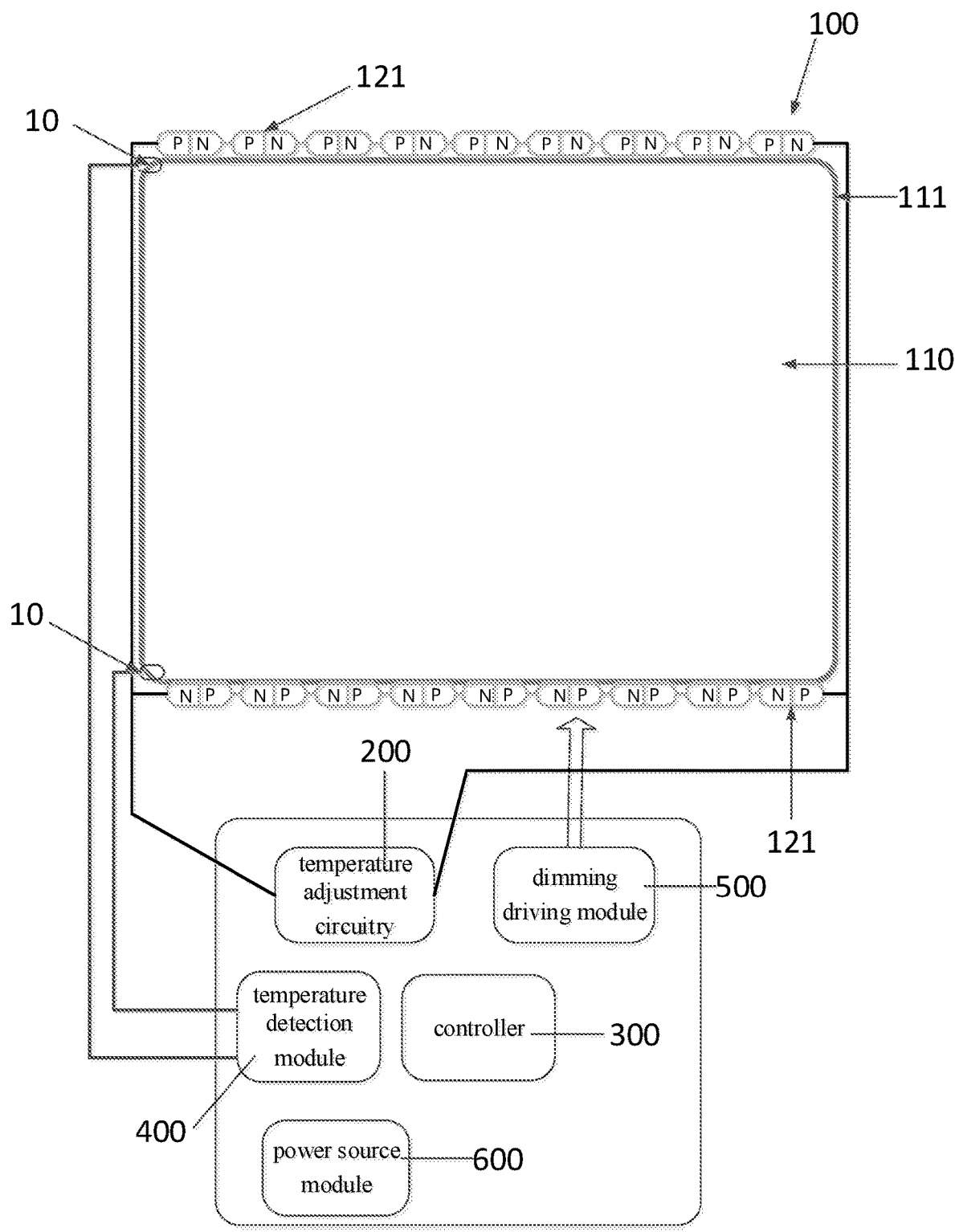
FIG. 2 is a schematic view showing one implementation mode of the windowing device according to one embodiment of the present disclosure.

As shown in FIG. 2, in one implementation mode, in the case of not changing the structure of the common dimming transparent substrate, the plurality of Peltier structures 121 may be attached, in an array form, to the outer surface of the transparent frame body 111 of the dimming transparent substrate 110, so as to form the windowing module whose temperature is adjustable in accordance with an environment temperature.

To be specific, as shown in FIG. 2, the plurality of Peltier structures 121 may be arranged in an array form at two opposite side surfaces of the transparent frame body 111 of the dimming transparent substrate 110, and each Peltier structure 121 may include a P pole (i.e., a first pole) and an N pole (i.e., a second pole) coupled to each other. An N pole of one Peltier structure 121 in the plurality of Peltier structures on each side surface may be coupled to a P pole of an adjacent Peltier structure 121. The Peltier structures 121 on a first side surface of the two opposite side surfaces may be arranged opposite to the Peltier structures 121 on a second side surface of the two opposite side surfaces respectively, a P pole of a first Peltier structure of two opposite Peltier structures 121 may be arranged opposite to an N pole of a second Peltier structure of the two opposite Peltier structures 121, and an N pole of the first Peltier structure may be arranged opposite to a P pole of the second Peltier structure.

In some possible embodiments of the present disclosure, as shown in FIG. 2, each Peltier structure 121 may be of an elongated shape, and the P pole of each Peltier structure and the N pole of the adjacent Peltier structure may be arranged in a lengthwise direction of the Peltier structure. On each side surface of the transparent frame body 111, the plurality of Peltier structures 121 may be connected in a serially-concatenated manner, i.e., in each serially-concatenated row, the N pole of each Peltier structure 121 may be coupled to the P pole of the adjacent Peltier structure 121, although there appears a small gap between the N pole of each Peltier structure 121 and the P pole of the adjacent Peltier structure 121, as shown in FIG. 2.

In some possible embodiments of the present disclosure, a plurality of serially-concatenated rows for the Peltier structures 121 may be provided on each side surface of the transparent frame body 111.

In some possible embodiments of the present disclosure, each Peltier structure 121 may be secured onto the dimming transparent substrate 110 through a thermally-conductive adhesive.

In some possible embodiments of the present disclosure, the temperature adjustment circuitry 200 may be coupled to the Peltier structures 121 at two ends of each serially-concatenated row, so that the plurality of Peltier structures 121 coupled in series may form a current loop. The temperature adjustment circuitry 200 may include a direction-variable constant current source configured to input a current in a first direction or a current in a second direction to the plurality of Peltier structures 121.

In some possible embodiments of the present disclosure, the temperature sensor 10 may be arranged on the outer surface of the transparent frame body 111. As shown in FIG. 2, the temperature sensor 10 may be arranged on each of the two opposite side surfaces of the transparent frame body 111 where the Peltier structure 121 is arranged. In some possible embodiments of the present disclosure, the temperature sensor 10 may be a thin film temperature sensor capable of collecting a temperature of the windowing module 100.

As shown in FIG. 2, in a possible embodiment of the present disclosure, the temperature adjustment circuitry 200 and the controller 300 may be integrated into a circuit board. In addition, in a possible embodiment of the present disclosure, the circuit board may also be provided with a temperature detection module 400 and a dimming driving module 500.

The temperature detection module 400 is configured to collect the temperature detected by the temperature sensor 10, and transmit the collected temperature to the controller 300 after data conversion and processing. The controller 300 may determine a current temperature state of the windowing module 100 in accordance with the temperature collected by the temperature sensor 10, and when the temperature of the windowing module 100 is beyond the predetermined temperature range, the temperature adjustment circuitry 200 may adjust the current inputted to the Peltier structure 121.

In some possible embodiments of the present disclosure, when the temperature detected by the temperature sensor 10 is greater than the upper threshold of the predetermined temperature range, i.e., the environment temperature is too high, the temperature adjustment circuitry 200 may input the current in the first direction to the Peltier structure 121, so as to enable a surface of the Peltier structure 121 adjacent to the liquid crystal layer to be a cooling surface, thereby to cool the windowing module 100. When the temperature detected by the temperature sensor 10 is smaller than or equal to the lower threshold of the predetermined temperature range, i.e., the environment temperature is relatively low, the temperature adjustment circuitry 200 may input the current in the second direction to the Peltier structure 121, so as to enable the surface of the Peltier structure 121 adjacent to the liquid crystal layer to be a heating surface, thereby to heat the windowing module 100.

Hence, based on the above, it is able to ensure the temperature of the windowing module 100 within the predetermined temperature range, thereby to prevent the occurrence of the dimming abnormalities for the dimming glass due to different light transmittances in different operating environments.

In the embodiments of the present disclosure, the dimming driving module 500 is configured to input an adjustment parameter to the dimming transparent substrate 110, so as to provide the dimming transparent substrate with different light transmittances when different adjustment parameters are inputted.

The adjustment parameter may include a voltage, and any other optional adjustment parameter, e.g., current or power.

In some possible embodiments of the present disclosure, as shown in FIG. 2, the circuit board may be further provided with a power source module 600 configured to provide a power source for each component of the circuit board. Of course, power may be supplied through any other external power source, which will not be particularly defined herein.

Figure 3:
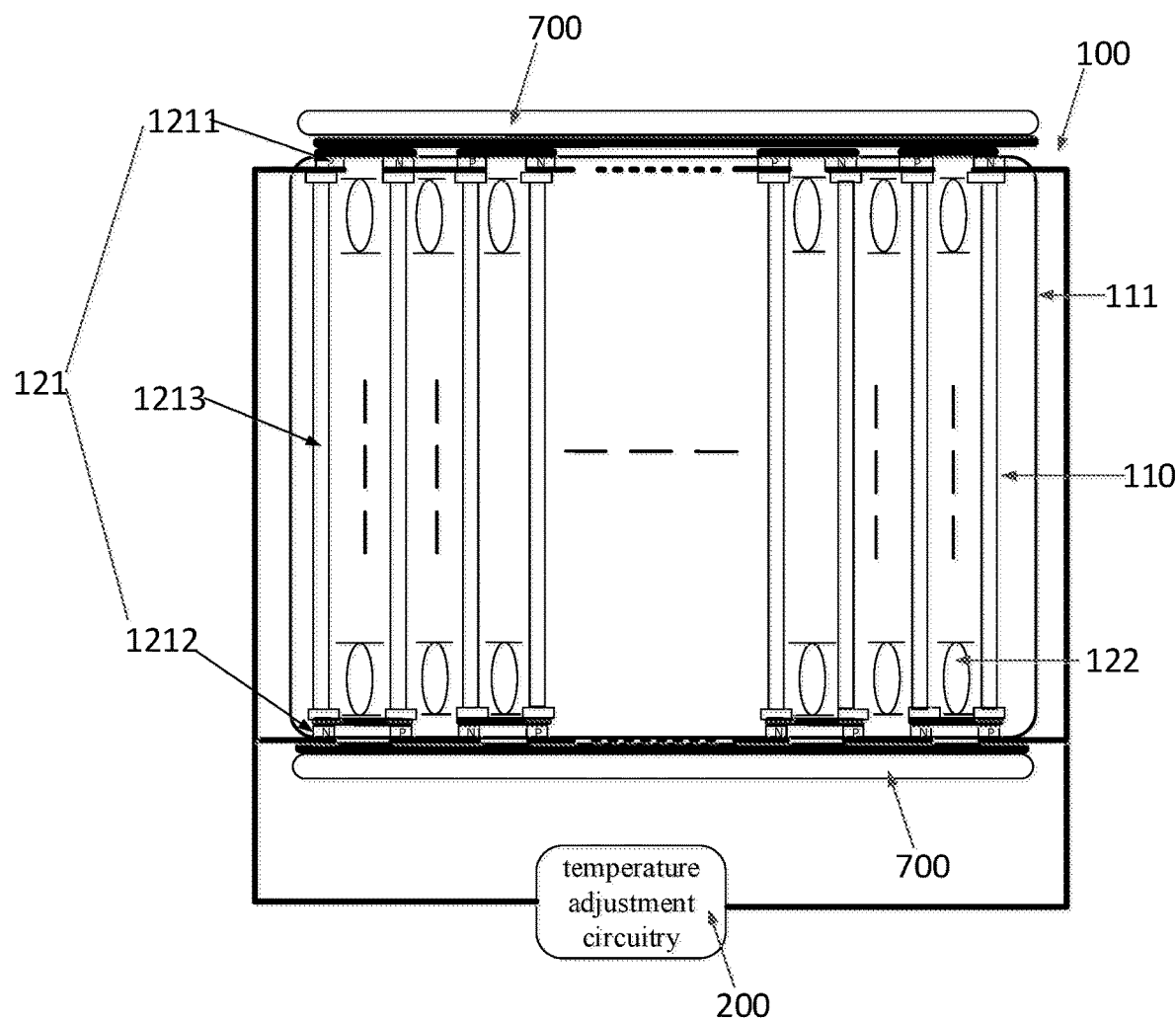
FIG. 3 is a schematic view showing another implementation mode of the windowing device according to one embodiment of the present disclosure.

As shown in FIG. 3, in another implementation mode of the semiconductor temperature adjustment element 120, the plurality of Peltier structures may be arranged within the transparent frame body 111 and formed in combination with the liquid crystal layer 122.

In some possible embodiments of the present disclosure, as shown in FIG. 3, each Peltier structure 121 may include a first pole 1211, a second pole 1212, and a transparent thermally-conductive line 1213 via which the first pole 1211 and the second pole 1212 are coupled to each other. The first pole 1211 and the second pole 1212 of each Peltier structure 121 may be arranged at two opposite sides of the liquid crystal layer 122 respectively, and the thermally-conductive line 1213 may be arranged inside the liquid crystal layer 122. The first poles 1211 and the second poles 1212 of the Peltier structures 121 may be arranged alternately at one side of the liquid crystal layer 122, and the first pole 1211 of each Peltier structure 121 may be coupled to the second pole 1212 of an adjacent Peltier structure 121. The first pole 1211 may be one of an N pole and a P pole, and the second pole 1212 may be the other one of the N pole and the P pole.

In some possible embodiments of the present disclosure, the first pole 1211, the second pole 1212 and the thermally-conductive line 1213 may be each made of a transparent material.

In some possible embodiments of the present disclosure, in the liquid crystal layer 122, the plurality of Peltier structures 121 each including the first pole 1211, the second pole 1212 and the thermally-conductive line 1213 may be arranged in an array form. In each row of the array, the first poles 1211 and the second poles 1212 of the plurality of Peltier structures 121 may be arranged alternately at two opposite sides of the liquid crystal layer 122, and the first pole 1211 of each Peltier structure 121 may be coupled to the second pole 1212 of the adjacent Peltier structure 121.

In some possible embodiments of the present disclosure, the first pole 1211 and the second pole 1212 of each Peltier structure 121 may be coupled to the thermally-conductive line 1213 via an insulating thermally-conductive adhesive.

In the embodiments of the present disclosure, as shown in FIG. 3, the temperature adjustment circuitry 200 may be coupled to the first poles 1211 or the second poles 1212 of the Peltier structures 121 at two ends of each row in the array, so that the plurality of Peltier structures 121 may form a current loop. The temperature adjustment circuitry 200 may include a direction-variable constant current source configured to input the current in the first direction or the current in the second direction to the plurality of Peltier structures 121.

In the above two implementation modes of the semiconductor temperature adjustment element 120, the windowing device may further include a heat dissipation element coupled to each Peltier structure 121 via thermally-conductive silica gel for heat transfer.

In some possible embodiments of the present disclosure, as shown in FIG. 2, the heat dissipation element may be arranged at each of two sides of the dimming transparent substrate 110 and coupled to each Peltier structure 121 at a corresponding side.

As shown in FIG. 3, the heat dissipation element 700 may be arranged at each of two sides of the liquid crystal layer 122 and coupled to the first pole or the second pole of each Peltier structure 121 at a corresponding side.

In some possible embodiments of the present disclosure, the heat dissipation element 700 may be of a structure consisting of a plurality of heat sinks, or a structure consisting of a plurality of thermally-conductive pipelines, which will not be particularly defined herein.

Identical to that in FIG. 2, the windowing device in FIG. 3 may further include the temperature sensor 10, the temperature adjustment circuitry 200, the controller 300, the temperature detection module 400 and the dimming driving module 500. A specific connection relationship among the members is the same as that in FIG. 2, and thus will not be particularly defined herein.

In the Peltier structure 121 as shown in FIG. 3, the transparent thermally-conductive line 1213 may be made of transparent Indium Tin Oxide (ITO), and the N pole and the P pole at two sides of the liquid crystal layer 122 may be coupled to each other via the thermally-conductive line 1213 to form the Peltier structure, also called as a Peltier circuitry. Electrode surfaces of the N pole and the P pole of each Peltier structure 121 away from the thermally-conductive line 1213 may be coupled to the heat dissipation element 700 at a corresponding side. The electrode surfaces of the N pole and the P pole coupled to the heat dissipation element 700 may form one temperature surface, and the electrode surfaces adjacent to the liquid crystal layer 122 and coupled to the thermally-conductive line 1213 may form another temperature surface.

The first pole and the second pole of each Peltier structure 121 at two sides of the liquid crystal layer 122 have opposite polarities, so when a current in a same direction is applied to the first pole and the second at the two opposite sides and the electrode surface of the first pole adjacent to the liquid crystal layer 122 is a heating surface, the polarity of the second pole at the other side may be opposite to the polarity of the first pole, and the electrode surface of the second pole adjacent to the liquid crystal layer 122 may also be a heating surface. Identically, when the electrode surface of the first pole adjacent to the liquid crystal layer 122 is a cooing surface, the electrode surface of the second electrode adjacent to the liquid crystal layer 122 may also be a cooling surface.

Based on the above, when the temperature of the dimming transparent substrate 110 has been detected, the temperature adjustment circuitry 200 may input different currents to the Peltier structures 121. When the detected temperature is smaller than or equal to the lower threshold of the predetermined temperature range, the temperature adjustment circuitry 200 may input the current in the second direction, so as to enable the electrode surface of each Peltier structure 121 adjacent to the liquid crystal layer 122 to be the heating surface, thereby to heat the windowing module 100. When the detected temperature is greater than the upper threshold of the predetermined temperature range, the temperature adjustment circuitry 200 may input the current in the first direction, so as to enable the electrode surface of each Peltier structure 121 adjacent to the liquid crystal layer 122 to be the cooling surface, thereby to cool the windowing module 100.

In some possible embodiments of the present disclosure, the current in the second direction may be a forward current, and the current in the first direction may be a backward current. Of course, the current in the second direction may be the backward current and the current in the first direction may be the forward current, which will not be particularly defined herein.

Based on the above-mentioned temperature adjustment mode, it is able to ensure the temperature of the windowing module 100 within the predetermined temperature range, thereby to ensure the normal operation of the windowing module 100 at different environment temperatures.

In the embodiments of the present disclosure, the predetermined temperature range may serve as a basis for temperature adjustment, and it may include the lower threshold and the upper threshold. In some possible embodiments of the present disclosure, the lower threshold may be greater than or equal to a minimum operating temperature of dye-doped liquid crystals, and the upper threshold be smaller than or equal to a maximum operating temperature of the dye-doped liquid crystals.

Figure 4:
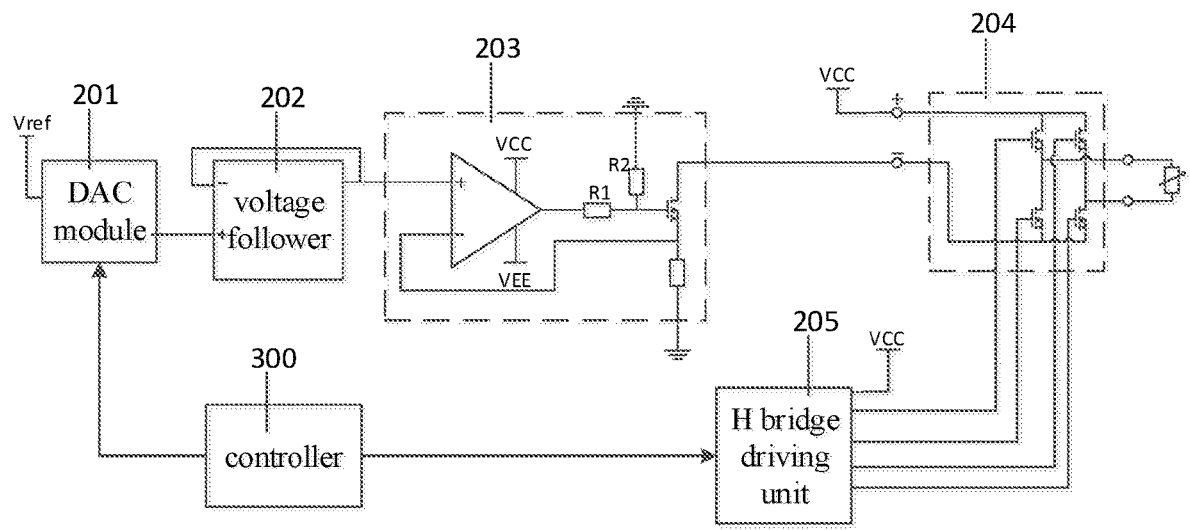
FIG. 4 is a schematic view showing a temperature adjustment circuitry according to one embodiment of the present disclosure.

In some possible embodiments of the present disclosure, as shown in FIG. 4, the temperature adjustment circuitry 200 may include a Digital-to-Analog Conversion (DAC) module 201, a voltage follower 202, a signal processing unit 203, an H bridge unit 204 and an H bridge driving unit 205. As shown in FIG. 4, the H bridge unit 204 may be coupled to the Peltier structure 121, and the controller 300 may be coupled to the DAC module 201 and the H bridge driving unit 205. The controller 300 is configured to adjust a voltage value applied to the H bridge driving unit 205, and the H bridge driving unit 205 is configured to control different transistors of the H bridge unit 204 to be in an ON state, so as to input the current in different directions to the Peltier structure 121. In addition, the controller 300 is further configured to adjust a value inputted to the DAC module 201, so as to adjust a magnitude of a current outputted by the H bridge unit 204, thereby to control a heating or cooling speed through the Peltier structure 121.

In the embodiments of the present disclosure, it is able for the windowing device to adjust the temperature of the dimming transparent substrate to be within the predetermined temperature range, thereby to prevent the occurrence of the dimming abnormalities for the dimming glass due to different light transmittances in different operating environments.

Figure 5:
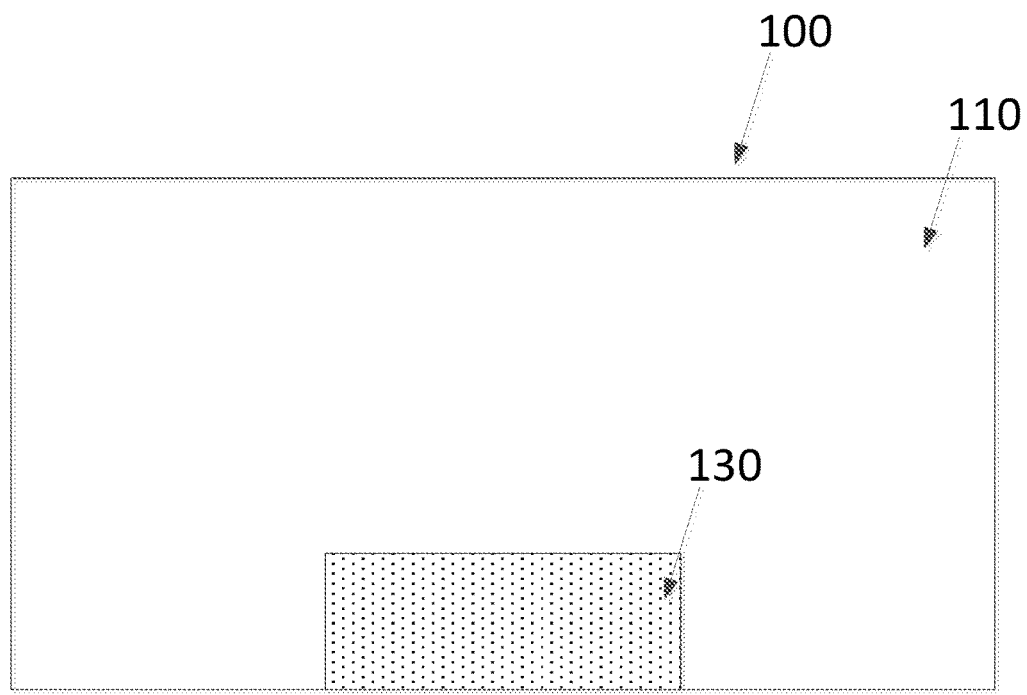
FIG. 5 is a schematic view showing the windowing device provided with a display panel according to one embodiment of the present disclosure.

In some other embodiments of the present disclosure, based on the above-mentioned structure, as shown in FIG. 5, the windowing module 100 may further include a transparent display panel 130 arranged opposite to the dimming transparent substrate 110, and an orthogonal projection of the transparent display panel 130 onto a plane where the dimming transparent substrate 110 is located is completely within the dimming transparent substrate 110.

In this structure, the dimming transparent substrate 110 and the transparent display panel 130 may be integrated together, so the windowing module 100 may be formed as a display structure which is capable of allowing light to pass therethrough and which is provided with a display function.

In some possible embodiments of the present disclosure, the transparent display panel 130 may be an Organic Light-Emitting Diode (OLED) display panel, and an area of the transparent display panel 130 may be smaller than an area of the dimming transparent substrate 110, i.e., the windowing module 110 formed by the dimming transparent substrate 110 and the transparent display panel 130 may be provided in such a manner that a part of the windowing module is used for displaying an image and the other part is the dimming glass.

As compared with a situation where a size of the transparent display panel 130 is arranged in accordance with a size of the dimming transparent substrate 110, the transparent display panel 130 may be arranged on a part of the dimming transparent substrate 110 to provide a regional display effect, so as to meet the requirement in a scenario where an interaction function is merely provided on a regional basis, thereby to prevent the occurrence of such problems as high cost and high power consumption when a display screen is provided on the entire dimming transparent substrate.

Figure 6:
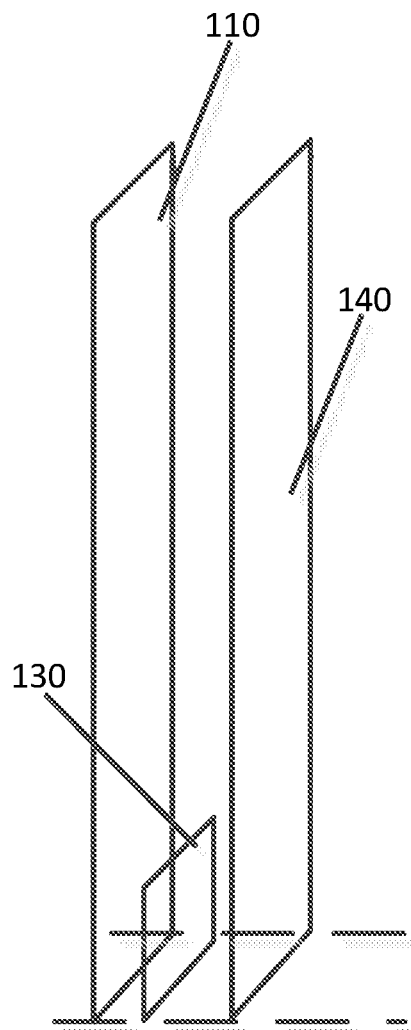
FIG. 6 is a perspective view of the windowing device according to one embodiment of the present disclosure.

In some possible embodiments of the present disclosure, as shown in FIG. 6, the windowing module may further include a touch panel 140 arranged at a side of the transparent display panel 130 away from the dimming transparent substrate 110, an orthogonal projection of the touch panel 140 onto the plane where the dimming transparent substrate 110 is located may cover the entire dimming transparent substrate 110, and the orthogonal projection of transparent display panel 130 onto the plane where the dimming transparent substrate 110 is located may cover a part of the dimming transparent substrate 110.

During the implementation, the transparent display panel 130 may be arranged on the dimming transparent substrate 110 on a regional basis, i.e., the transparent display panel 130 may be arranged on merely a part of the dimming transparent substrate 110, so as to provide a regional display function and a sightseeing function. In some possible embodiments of the present disclosure, the transparent display panel 130 may be secured to the dimming transparent substrate 110 through an Optically Clear Adhesive (OCA). In addition, in the embodiments of the present disclosure, the touch panel 140 may be arranged at a side of the transparent display panel 130, and an area of the touch panel 140 maybe greater than the area of the transparent display panel 130. In some possible embodiments of the present disclosure, a shape and an area of the touch panel 140 may be identical to those of the dimming transparent substrate 110, i.e., the touch panel 140 may cover the entire dimming transparent substrate 110, so as to provide the windowing module 100 with such a structure with a regional display function and an entire-surface touch function, thereby to facilitate a touch function, and prevent a display effect from being adversely affected when the touch panel 140 is arranged on a part of the dimming transparent substrate 110 and the dimming transparent substrate 110 is shielded by a black frame of the touch panel 140.

Figure 7:
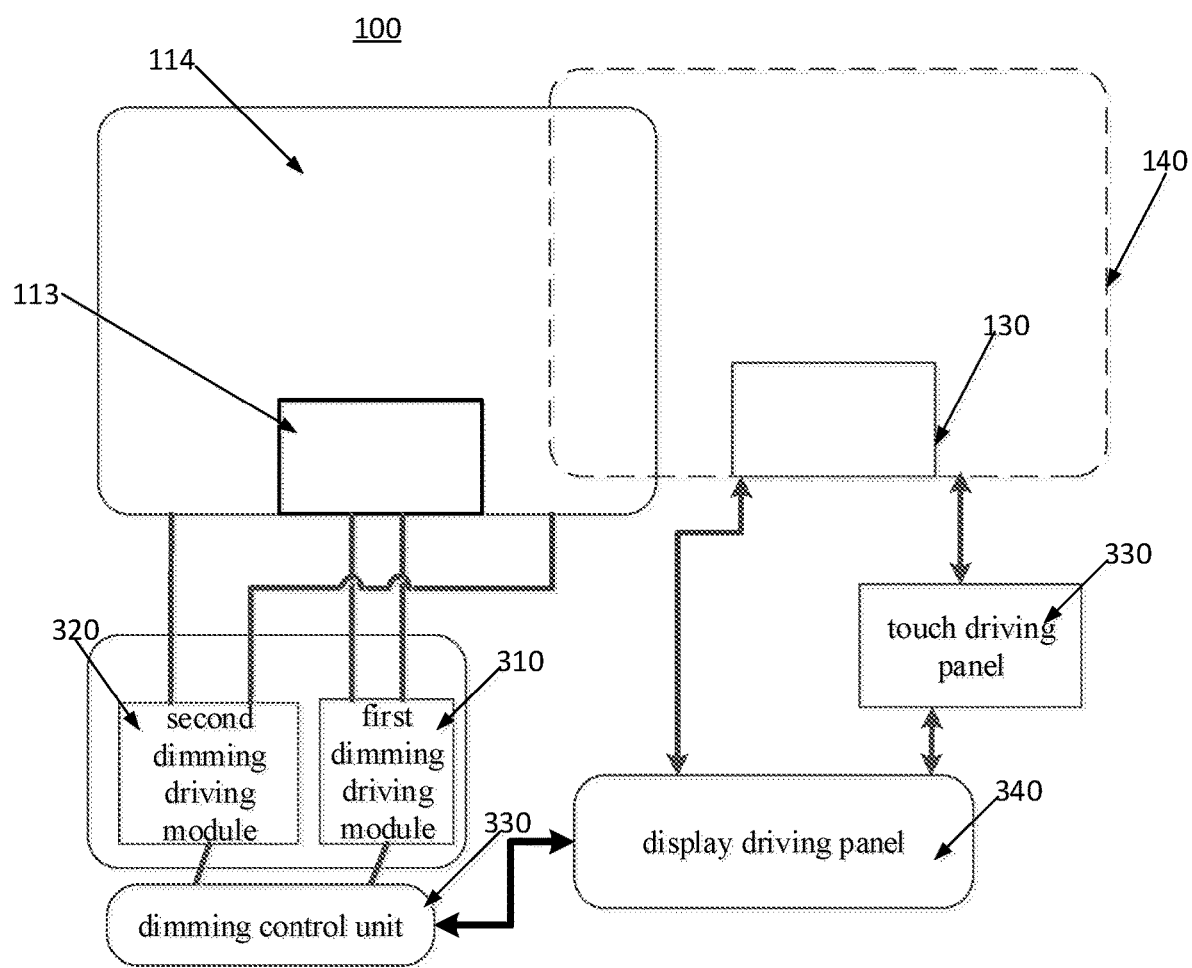
FIG. 7 is a schematic view showing connection lines of the windowing device according to one embodiment of the present disclosure.

In some possible embodiments of the present disclosure, as shown in FIG. 7, the dimming transparent substrate 110 may include a first dimming transparent substrate 113 and a second dimming transparent substrate 114 spliced together. The transparent display panel 130 may be arranged opposite to the first dimming transparent substrate 113, and the orthogonal projection of the transparent display panel 130 onto the plane where the dimming transparent substrate 110 is located may be entirely located within the first dimming transparent substrate 113.

In some possible embodiments of the present disclosure, a shape and an area of the first dimming transparent substrate 113 may be the same as those of the transparent display panel 130.

Based on the above structure, the first dimming transparent substrate 113 of the dimming transparent substrate 110 may be integrated with the transparent display panel 130 for displaying an image, and the second dimming transparent substrate 114 may be used to achieve an adjustable sightseeing effect.

In some possible embodiments of the present disclosure, as shown in FIG. 7, the windowing device may further include: a first dimming driving module 310 coupled to the first dimming transparent substrate 113 and configured to input an adjustment parameter to the first dimming transparent substrate 113; a second dimming driving module 320 coupled to the second dimming transparent substrate 114 and configured to input an adjustment parameter to the second dimming transparent substrate 114; and a dimming control unit 330 coupled to the first dimming driving module 310 and the second dimming driving module 320, and configured to input a driving signal to the first dimming driving module 310 and the second dimming driving module 320, so as to adjust the adjustment parameter inputted by the first dimming driving module 310 and the second dimming driving module 320.

The windowing device may further include: a touch driving panel 330 coupled to the touch panel 140 and configured to input a touch signal to the touch panel 140; and a display driving panel 340 coupled to the transparent display panel 130, the touch driving panel 330 and the dimming control unit 330 respectively, and configured to control the display of the transparent display panel 130, and control the touch signal inputted to the touch panel 140 and a dimming signal inputted to the first dimming transparent substrate 113 and the second dimming transparent substrate 114 in accordance with an image displayed by the transparent display panel 130.

The windowing module 100 with the above-mentioned structure may be applied to windows of a subway, a train and a bus. Based on a regional dimming technology, the windowing device has such a structure with regional display and entire-surface touch, so it is able to achieve a dimming function independently in a display region and a non-display region and achieve a touch function in the display region, thereby to provide a completely transparent window and adjust the light transmittance of the window. As a result, a user may interact with the window in a better manner, without adversely affecting the sightseeing function, so as to improve the user experience.

The present disclosure further provides in some embodiments a windowing system which includes the above-mentioned windowing device.

In order to achieve rapid location and emergency handling of a fault of the windowing system, based on an Internet of Things (IoT) in combination with an Artificial Intelligence (AI) algorithm, the windowing system in the embodiments of the present disclosure may rapidly discover and locate the fault, and feed it back to a cloud platform in real time, so as to provide a maintenance scheme.

Figure 8:
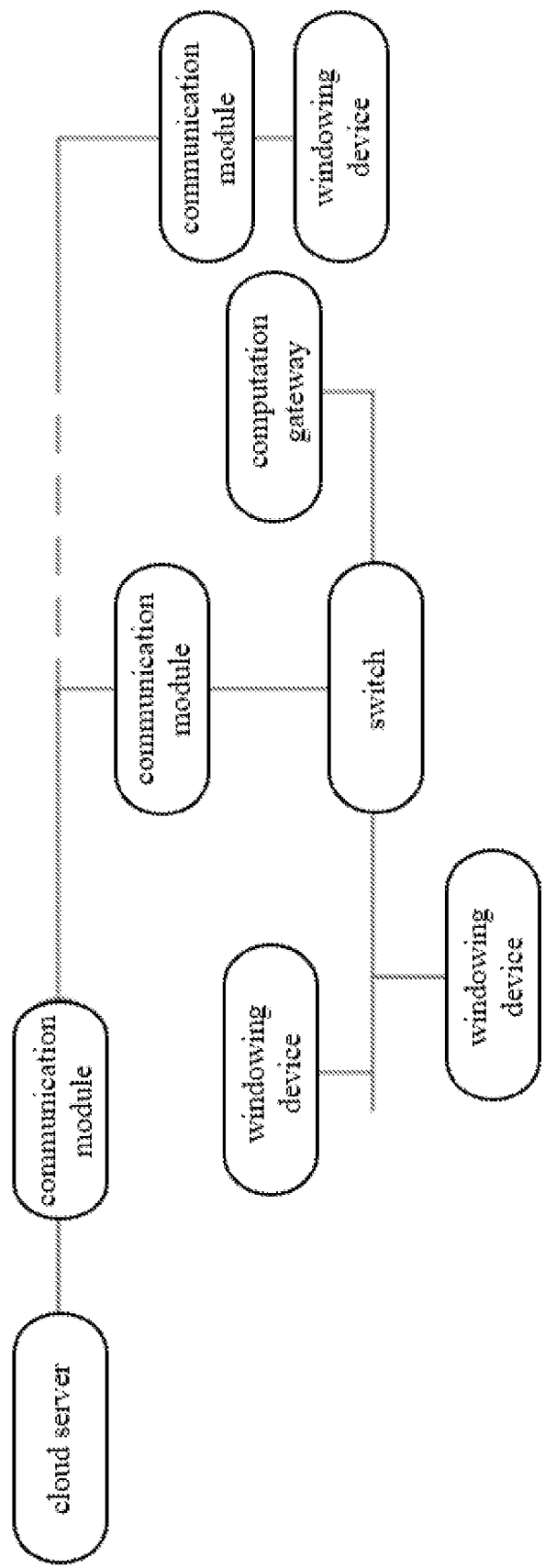
FIG. 8 is a schematic view showing architecture of a windowing system according to one embodiment of the present disclosure.

In some possible embodiments of the present disclosure, the windowing system may be applied to a smart vehicle window IoT system, and the windowing device may be a window of the train or subway. As shown in FIG. 8, the windowing system may include a switch coupled to each windowing device, and a computation gateway coupled to the switch. In some possible embodiments of the present disclosure, the windowing system may further include a cloud server coupled to the switch via a communication module. The windowing devices for different carriages may communicate with a communication network via the communication module, and may be coupled to the computation gateway and the cloud server.

The communication module, the computation gateway and the windowing devices may be combined together to form IoT architecture.

In some possible embodiments of the present disclosure, the communication module may use a wireless communication mode, e.g., $4^{th}$-Generation (4G), $5^{th}$-Generation or Wireless Fidelity (WiFi) communication mode, or a wired communication mode, e.g., Ethernet, so as to provide a communication link for the computation gateway and the cloud server.

In some possible embodiments of the present disclosure, the computation gateway may be in a server mode, and it may communicate with the windowing device via a switch in conventional architecture for the train or subway. The computation gateway may be implemented in the form of a background monitoring AI program, or implemented in the form of a Central Processing Unit (CPU).

It should be appreciated that, in the embodiments of the present disclosure, the windowing device of the windowing system may include a display panel and a display driving panel, or include a dimming transparent substrate, the display panel, a dimming driving module and the display driving panel, or include the dimming transparent substrate, the display panel, a touch panel, the dimming driving module, the display driving panel and a touch driving panel.

Figure 9:
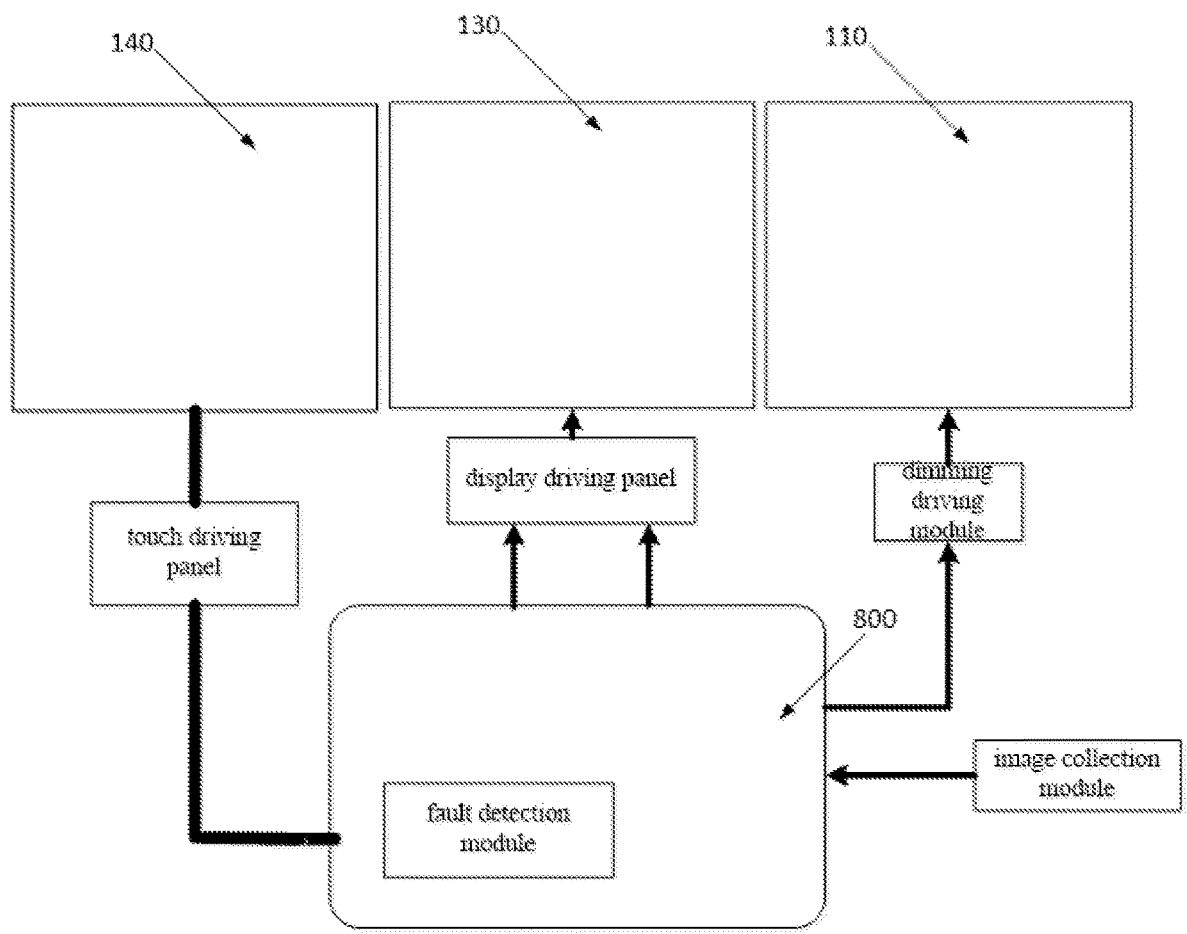
FIG. 9 is a schematic view showing a board card structure of the windowing device in the windowing system according to one embodiment of the present disclosure.

As shown in FIG. 9, in some embodiments of the present disclosure, the windowing device may include the dimming transparent substrate 110, the transparent display panel 130 and the touch panel 140. A main control panel 800 may be coupled to the transparent display panel 130 via the display driving panel, coupled to the touch panel 140 via the touch driving panel, and coupled to the dimming transparent substrate 110 via the dimming driving module.

Figure 10:
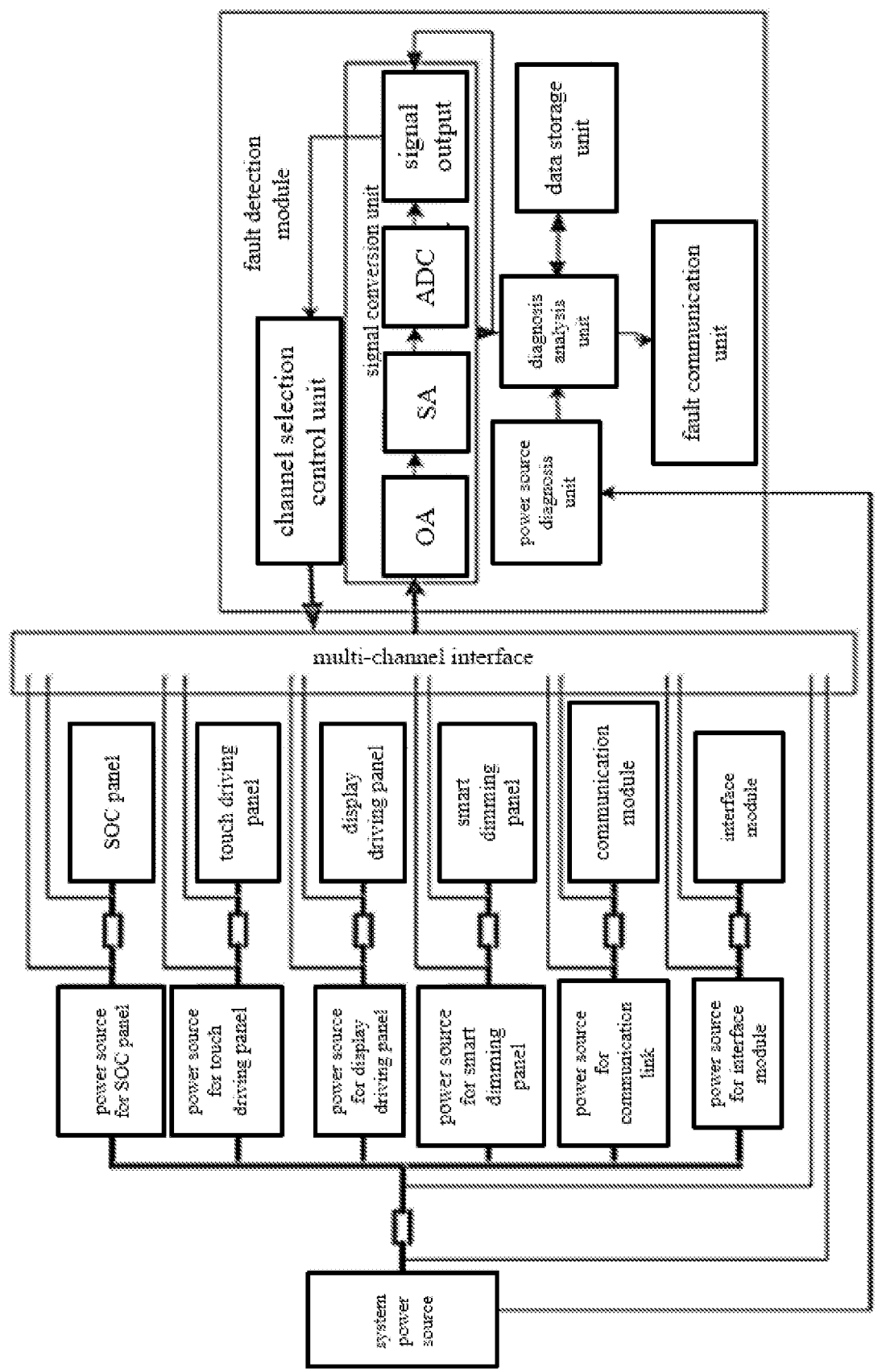
FIG. 10 is a schematic view showing a board card connection of a fault detection module and the windowing device in the windowing system according to one embodiment of the present disclosure.

As shown in FIG. 10, In some possible embodiments of the present disclosure, the windowing device may further include: a plurality of control panels coupled to the windowing module; a power source coupled to the control panels and configured to provide electric energy for each control panel; and a fault detection module coupled to the control panels and the power source and configured to perform fault detection on the control panels and the power source.

As shown in FIGS. 9 and 10, the fault detection module may be arranged on the main control panel 800, and the plurality of control panels may include the touch driving panel, the display driving panel, the dimming driving module, the communication module and an interface module on the windowing device.

In some possible embodiments of the present disclosure, as shown in FIG. 10, the fault detection module may include: a multi-channel interface, each channel interface being coupled to one of the control panels; a signal conversion unit coupled to the multi-channel interface and configured to convert a voltage signal inputted by one channel interface into a digital signal; and a channel selection control unit configured to select one channel interface of the multi-channel interface and control the selected channel interface to be coupled to the signal conversion unit; a power source diagnosis unit coupled to the power source and configured to detect a voltage of the power source; and a diagnosis analysis unit coupled to the signal conversion unit and the power source diagnosis unit, and configured to perform fault detection on the control panel coupled to a corresponding channel interface in accordance with the digital signal for the channel interface converted by the signal conversion unit, and perform fault detection on the power source in accordance with a detection result of the power source analysis unit.

In some possible embodiments of the present disclosure, the signal conversion unit may include an operational amplification (OA) sub-unit, a signal amplification (SA) sub-unit, an analog-to-digital conversion (ADC) sub-unit and a signal output sub-unit.

In some possible embodiments of the present disclosure, the fault detection module may further include: a data storage unit coupled to the diagnosis analysis unit and configured to store the detection result of the diagnosis analysis unit; and a fault communication unit coupled to the diagnosis analysis unit and configured to transmit the detection result of the diagnosis analysis unit to a transmission network of the vehicle window IoT system.

Through the fault detection module with the above-mentioned structure, it is able to acquire a power supply situation through detecting voltages and currents applied to the control panels, thereby to determine whether each board card operates normally.

In some possible embodiments of the present disclosure, the windowing system may further include an image collection module configured to collect a display state of the windowing module. The display state collected by the image collection module may be transmitted to the transmission network of the vehicle window IoT system, and then transmitted to the computation gateway. The computation gateway may transmit a control parameter to the main control panel, acquire the display state collected by the image collection module, and compare the display state with a predetermined state in which the windowing module should be in accordance with the control parameter, so as to perform fault diagnosis.

In some possible embodiments of the present disclosure, the image collection module may include, but not limited to, a camera.

In some possible embodiments of the present disclosure, the image collection module may be coupled to the main control panel of the windowing device via a Universal Serial Bus (USB) interface, as shown in FIG. 9.

In some possible embodiments of the present disclosure, the computation gateway is further configured to: transmit a testing picture to each control panel, and acquire, through the image collection module, a display state in which the testing picture is displayed by the transparent display panel of the windowing device; and perform fault diagnosis in accordance with the testing picture and the display state.

The fault of the windowing device may be preliminarily detected through the image collection module. For example, when such a phenomenon as flickering screen, black screen or white screen occurs for the transparent display panel, the display state of the windowing device may be acquired by the image collection module (e.g., the camera arranged at a position facing the windowing device), and then uploaded to the computation gateway. The computation gateway may determine the state of the windowing device in accordance with preset image or video information. When the current display state of the windowing device is inconsistent with a preset image, the computation gateway may preliminarily determine that a fault occurs for the windowing device, and further transmit a standard image to the windowing device. The windowing device may display the standard image, and the camera may acquire a display state of the windowing device that displays the standard image again and transmit it to the computation gateway for comparison. When the detected display state is inconsistent with the standard image, the computation device may determine that the fault occurs for the windowing device, and report the fault to the cloud server.

Through the above-mentioned detection ode, it is also able to detect a transmission fault for the communication module. The communication module may be in a wired or wireless transmission mode. Regardless of the transmission mode, when the windowing device fails to receive image data or the received image data is incorrect, the camera may collect image information, and report it to the computation gateway, and the computation gateway may issue data about the standard image again. When the windowing device still fails to receive the image data and fails to display the standard image, the computation gateway may also report the fault to the cloud server.

In the embodiments of the present disclosure, whether each board card operates normally may be determined in accordance with the display state collected by the image collection module in conjunction with a fault detection result acquired by the fault detection module.

For example, when a power source module for each board card operates normally depending on the fault detection result acquired by the fault detection module and a black screen state has been collected by the image collection module, a display screen fault may be reported to the cloud server. When the power source module for each board card operates normally depending on the fault detection result acquired by the fault detection module and the image data is transmitted by a transmitting end normally but the windowing device fails to receive any signal, a communication board fault may be reported to the cloud server. In a word, it is able to not only report the fault roughly, but also locate the board card fault within a smaller range.

According the windowing system in the embodiments of the present disclosure, on the basis of an Internet of Vehicle (IoV) in conjunction with a communication line for the train, bullet train or subway to which the windowing device is applied, it is able to discover, analyze and report the fault of the smart vehicle window using a wired or wireless technology in combination with an edge computation gateway.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A windowing device, comprising:
a windowing module comprising a dimming transparent substrate and a semiconductor temperature adjustment element arranged on the dimming transparent substrate, the dimming transparent substrate being provided with different light transmittances when the dimming transparent substrate has different adjustment parameters;
a temperature adjustment circuitry coupled to the semiconductor temperature adjustment element, and configured to input a current to the semiconductor temperature adjustment element and adjust a temperature of the semiconductor temperature adjustment element;
a temperature sensor arranged on the windowing module and configured to detect a temperature of an environment where the windowing module is located; and
a controller coupled to the temperature sensor and the temperature adjustment circuitry, and configured to input a circuitry adjustment signal to the temperature adjustment circuitry when the temperature detected by the temperature sensor is beyond a predetermined temperature range, so that the temperature adjustment circuitry adjusts the current inputted to the semiconductor temperature adjustment element in such a manner as to adjust a temperature of the dimming transparent substrate to be within the predetermined temperature range through adjusting the temperature of the semiconductor temperature adjustment element;
wherein the windowing module further comprises a transparent display panel arranged opposite to the dimming transparent substrate, and an orthogonal projection of the transparent display panel onto a plane where the dimming transparent substrate is located is completely within the dimming transparent substrate; and
the windowing module further comprises a touch panel arranged at a side of the transparent display panel away from the dimming transparent substrate, an orthogonal projection of the touch panel onto the plane where the dimming transparent substrate is located covers the entire dimming transparent substrate, and the orthogonal projection of transparent display panel onto the plane where the dimming transparent substrate is located covers a part of the dimming transparent substrate.

2. The windowing device according to claim 1, wherein the semiconductor temperature adjustment element comprises one or more Peltier structures, the dimming transparent substrate comprises a transparent frame body and a liquid crystal layer arranged within the transparent frame body, and the one or more Peltier structures are attached to an outer surface of the transparent frame body.

3. The windowing device according to claim 2, wherein when the one or more Peltier structures are arranged at the outer surface of the transparent frame body, each of two opposite side surfaces of the dimming transparent substrate is provided with one or more Peltier structures arranged in an array form,
wherein each Peltier structure comprises a first pole and a second pole coupled to each other, in the Peltier structures at each side surface, a first pole of one Peltier structure is coupled to a second pole of an adjacent Peltier structure,
wherein one or more Peltier structures on a first side surface of the two opposite side surfaces are arranged opposite to one or more Peltier structures on a second side surface of the two opposite side surfaces respectively, a first pole of a first Peltier structure of two opposite Peltier structures is arranged opposite to a second pole of a second Peltier structure of the two opposite Peltier structures, and a second pole of the first Peltier structure is arranged opposite to a first pole of the second Peltier structure,
wherein the first pole is one of an N pole and a P pole, and the second pole is the other one of the N pole and the P pole.

4. The windowing device according to claim 2, further comprising a heat dissipation element coupled to each Peltier structure.

5. The windowing device according to claim 2, wherein each Peltier structure is of an elongated shape, and the first pole of each Peltier structure and the second pole of the adjacent Peltier structure are arranged in a lengthwise direction of the Peltier structure.

6. The windowing device according to claim 1, wherein the semiconductor temperature adjustment element comprises one or more Peltier structures, the dimming transparent substrate comprises a transparent frame body and a liquid crystal layer arranged within the transparent frame body, and the one or more Peltier structures are formed within the transparent frame body.

7. The windowing device according to claim 6, wherein when the one or more Peltier structures are arranged within the transparent frame body, each Peltier structure comprises a first pole, a second pole, and a transparent thermally-conductive line via which the first pole is coupled to the second pole,
wherein the first pole and the second pole of each Peltier structure are arranged at two opposite sides of the liquid crystal layer respectively, the thermally-conductive line is arranged inside the liquid crystal layer, the first poles and the second poles of the Peltier structures are arranged alternately at one side of the liquid crystal layer, and the first pole of each Peltier structure is coupled to the second pole of an adjacent Peltier structure, and
wherein the first pole is one of an N pole and a P pole, and the second pole is the other one of the N pole and the P pole.

8. The windowing device according to claim 7, wherein the first pole and the second pole of each Peltier structure are coupled to the thermally-conductive line via an insulating thermally-conductive adhesive respectively.

9. The windowing device according to claim 6, further comprising a heat dissipation element coupled to each Peltier structure.

10. The windowing device according to claim 1, wherein the controller is configured to input a first circuitry adjustment signal to the temperature adjustment circuitry when the temperature detected by the temperature sensor is greater than an upper threshold of the predetermined temperature range, and input a second circuitry adjustment signal to the temperature adjustment circuitry when the temperature detected by the temperature sensor is smaller than or equal to a lower threshold of the predetermined temperature range,
wherein the temperature adjustment circuitry is further configured to input a current in a first direction to the semiconductor temperature adjustment element in accordance with the first circuitry adjustment signal, and input a current in a second direction to the semiconductor temperature adjustment element in accordance with the second circuitry adjustment signal.

11. The windowing device according to claim 1, wherein the dimming transparent substrate comprises a first dimming transparent substrate and a second dimming transparent substrate spliced together, the transparent display panel is arranged opposite to the first dimming transparent substrate, and the orthogonal projection of the transparent display panel onto the plane where the dimming transparent substrate is located is completely within the first dimming transparent substrate.

12. The windowing device according to claim 11, further comprising a first dimming driving module coupled to the first dimming transparent substrate and configured to input an adjustment parameter to the first dimming transparent substrate, and a second dimming driving module coupled to the second dimming transparent substrate and configured to input an adjustment parameter to the second dimming transparent substrate.

13. The windowing device according to claim 1, wherein the temperature adjustment circuitry is a direction-variable constant current source, and the temperature sensor is thin film temperature sensor.

14. A windowing system, comprising a windowing device, wherein the windowing device comprises:
  a windowing module comprising a dimming transparent substrate and a semiconductor temperature adjustment element arranged on the dimming transparent substrate, the dimming transparent substrate being provided with different light transmittances when the dimming transparent substrate has different adjustment parameters;
  a temperature adjustment circuitry coupled to the semiconductor temperature adjustment element, and configured to input a current to the semiconductor temperature adjustment element and adjust a temperature of the semiconductor temperature adjustment element;
  a temperature sensor arranged on the windowing module and configured to detect a temperature of an environment where the windowing module is located; and
  a controller coupled to the temperature sensor and the temperature adjustment circuitry, and configured to input a circuitry adjustment signal to the temperature adjustment circuitry when the temperature detected by the temperature sensor is beyond a predetermined temperature range, so that the temperature adjustment circuitry adjusts the current inputted to the semiconductor temperature adjustment element in such a manner as to adjust a temperature of the dimming transparent substrate to be within the predetermined temperature range through adjusting the temperature of the semiconductor temperature adjustment element;
  wherein the windowing device further comprises: a plurality of control panels coupled to the windowing module; a power source coupled to the plurality of control panels and configured to provide electric energy for each control panel; and a fault detection module coupled to the plurality of control panels and the power source and configured to perform fault detection on the plurality of control panels and the power source; and
  the fault detection module comprises:
  a multi-channel interface, each channel interface being coupled to one of the plurality of control panels;
  a signal conversion unit coupled to the multi-channel interface and configured to convert a voltage signal inputted by one channel interface into a digital signal;
  a channel selection control unit configured to select one channel interface of the multi-channel interface and control the selected channel interface to be coupled to the signal conversion unit;
  a power source diagnosis unit coupled to the power source and configured to detect a voltage of the power source; and
  a diagnosis analysis unit coupled to the signal conversion unit and the power source diagnosis unit, and configured to perform fault detection on the control panel coupled to a corresponding channel interface in accordance with the digital signal for the channel interface converted by the signal conversion unit, and perform fault detection on the power source in accordance with a detection result of the power source analysis unit.

15. The windowing system according to claim 14, further comprising:
  an image collection module configured to collect a display state of the windowing module; and
  a computation gateway coupled to the control panels and the image collection module, and configured to transmit a control parameter to the plurality of control panels, acquire the display state collected by the image collection module, and compare the display state with a predetermined state in which the windowing module should be in accordance with the control parameter, so as to perform fault diagnosis.

16. The windowing system according to claim 15, wherein the computation gateway is further configured to: transmit a testing picture to each control panel, and acquire, through the image collection module, a display state in which the testing picture is displayed by the transparent display panel of the windowing device; and perform fault diagnosis in accordance with the testing picture and the display state.

* * * * *